United States Patent [19]

Pogue, Jr.

[11] Patent Number: 4,503,513

[45] Date of Patent: Mar. 5, 1985

[54] RADIO RECEIVER SYSTEM INCLUDING A CONTROL UNIT AND A REMOTE UNIT

[75] Inventor: Russell W. Pogue, Jr., Kokomo, Ind.

[73] Assignee: General Motors Corporation, Detroit, Mich.

[21] Appl. No.: 175,122

[22] Filed: Aug. 4, 1980

[51] Int. Cl.³ .......................... G06F 15/16; H04B 1/38
[52] U.S. Cl. ...................................... 364/900; 455/77; 455/151
[58] Field of Search ... 364/200 MS File, 900 MS File; 340/825.63; 455/77, 151, 152, 165

[56] References Cited

U.S. PATENT DOCUMENTS

| | | | |
|---|---|---|---|
| 3,798,611 | 3/1974 | Gallant et al. | 364/900 |
| 4,122,304 | 10/1978 | Mallien | 364/900 |
| 4,147,984 | 4/1979 | Coudel et al. | 364/900 |
| 4,311,986 | 1/1982 | Yee | 340/825.63 |

Primary Examiner—Gareth D. Shaw
Assistant Examiner—Daniel K. Dorsey
Attorney, Agent, or Firm—Albert F. Duke

[57] ABSTRACT

An automobile radio receiver system includes a control unit located in the passenger compartment and a remote unit, for example, in the trunk compartment of the automobile. The control unit includes a master microcomputer which controls a display and responds to keyboard inputs. The remote unit includes the radio receiver which is controlled by a slave microcomputer. The master and slave microcomputers are interconnected by a single wire data bus. Data regarding keyboard inputs are transmitted to the slave and data regarding receiver status is transmitted to the master. The data is interleaved on a bit by bit basis with master controlling the timing of data transmission thereby permitting a relatively imprecise timing base in the slave.

10 Claims, 13 Drawing Figures

RADIO RECEIVER SYSTEM INCLUDING A CONTROL UNIT AND A REMOTE UNIT

FIELD OF THE INVENTION

This invention relates to radio receiver systems and, more particularly, to an automobile radio receiver system comprising a control unit and a remote unit both of which are under the control of respective microcomputers which communicate one with the other over a single wire bi-directional serial data bus.

BACKGROUND OF THE INVENTION

For a number of years various proposals have been put forth to relocate the radio receiver from its present position in the instrument panel to a remote location such as the trunk area of the automobile. More recently, a proliferation of display functions in the automobile and a concurrent decrease in the available space in the instrument panel area has caused increased interest in such proposals. There are a number of advantages associated with removing the receiver from the instrument panel area. For example, relocation permits size and shape considerations to be made without reference to instrument panel design. Also, certain advantages associated with service and maintenance of the receiver may occur. One of the major drawbacks associated with prior proposals is the increased cost associated with the additional wiring and connectors required between the remote receiver unit and the control unit.

SUMMARY OF THE INVENTION

With the foregoing in mind it is an object of the present invention to provide a communication system including a microcomputer based control unit and a microcomputer based remote unit interconnected by a single wire bidirectional data bus and wherein the microcomputer in the control unit controls the timing of the communication of data between the two units.

It is another object of the present invention to provide a radio receiver system wherein a master microcomputer monitors operator actuable switch inputs and transmits commands to a slave microcomputer which controls the receiver in accordance with the commands and transmits receiver status information to the master microcomputer which utilizes the status information to control a display.

It is another object of the present invention to provide a radio receiver system including a remote receiver unit and a control unit each comprising a microcomputer interconnected by a single wire bidirectional data bus and wherein a bit of data is transferred in both directions during a bit transfer period.

In accordance with the present invention an automobile radio receiver system is provided which includes a control unit mounted within ready access to the operator of the vehicle. A remote unit is interconnected with the control unit by a power supply line and a single wire bidirectional data bus. The data bus interconnects two microcomputers, one of which is located in the control unit and the other of which is located in the remote unit. The control unit includes an input keyboard and an output display. The control unit microcomputer responds to keyboard inputs by the operator and transfers coded data corresponding to the keyboard status to the remote unit microcomputer which decodes the data and controls the receiver in accordance therewith. For example, the data may command the remote unit microcomputer to tune the receiver to a new station or adjust the audio control settings. When the control unit commands are carried out, the new status of the receiver is transmitted from the remote unit microcomputer to the control unit microcomputer for display and storage. The control unit microcomputer is continuously energized from the vehicle battery whereas the remote unit microcomputer is energized through an ON/OFF switch by the operator. Thus when the remote unit is powered down, the receiver status information is retained by the control unit. When the remote unit is powered up, the status information stored in the control unit microcomputer is dumped to the remote unit microcomputer to establish the previous status of the receiver.

The two microcomputers operate under a master-slave relationship. The control unit microcomputer is the master and is provided with a precise time base in order to provide an accurate time of day display. The control unit microcomputer therefore controls the start of each data bit transfer and a bit of data is transferred between the master and slave each bit transfer period. In other words the data bits are interleaved.

A more complete understanding of the present invention may be had from the following detailed description which should be read in conjunction with the drawings, in which:

DESCRIPTION OF THE PREFERRED EMBODIMENT

Figure 1:
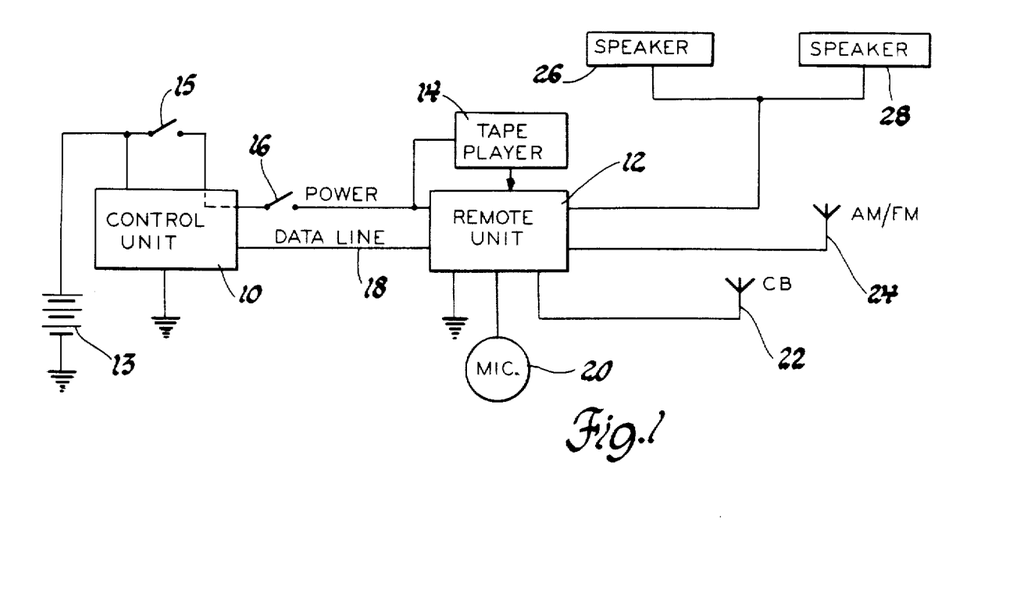
FIG. 1 is a block diagram of the receiver system.

Referring now to the drawings and initially to FIG. 1, the receiver system of the present invention comprises a control unit generally designated 10 and a remote unit generally designated 12. The control unit 10 is powered from the vehicle battery 13. Power is supplied to the remote unit 12 and a tape player 14 from the ignition switch 15 through a manually actuable ON/OFF switch 16. The control unit 10 and remote unit 12 each include single chip microcomputers which communicate one with the other, over a serial bidirectional data bus line 18. A suitable microcomputer is the 8048, which includes an 8-bit event counter/timer controllable by program instructions to perform such functions as counting external events and generating accurate time delays. The 8048 is described in the User's Manual which is incorporated herein and is available from INTEL Corporation, Santa Clara, California. The remote unit 12 receives inputs from a CB microphone 20, a CB antenna 22, an AM/FM antenna 24, and provides output signals to a plurality of speakers, two of which are shown and designated 26 and 28.

Figure 2:
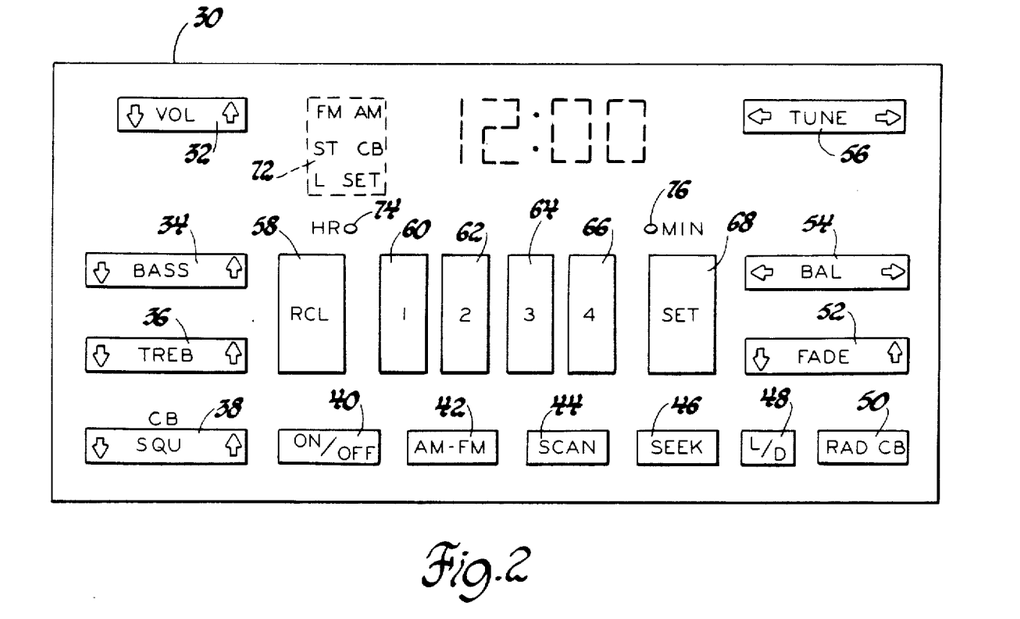
FIG. 2 is a front view of the panel of the control unit.

The control unit 10 is located within ready access to the vehicle driver, for example, in the instrument panel of the vehicle and may include a front panel 30 such as shown in FIG. 2. Protruding through the panel are a plurality of operator actuable keys 32–68 for controlling the remote unit 12. A digital display is viewable through the panel for displaying time-of-day, AM/FM frequency, or CB channel information. Enunciators 72 are provided to indicate the status of the receiver. A plurality of momentary contact switches (FIG. 3) are actuatable by the keys for selecting a plurality of radio operating conditions, such as AM/FM, SCAN, SEEK and LOCAL/DISTANT. The ON/OFF power switch 16 actuable from the key 40 is preferably a push-push type switch which mechanically latches in either the ON or OFF positions.

The TUNE, VOLUME, BASS, TREBLE, BALANCE, FADE and CB SQUELCH keys, respectively, each selectively actuate two momentary contact switches. The switches control the designated functions in two directions by pressing in the locations of the arrows shown. By pressing in the middle of the BASS, TREBLE, BALANCE or FADE key, both switches may be closed simultaneously and be interpreted as a mid-position command. The TUNE key 56 may be actuated to selectively increment or decrement the entertainment or CB receiver by one station or channel per actuation. By concurrently actuating the increment and decrement switches of the TUNE key 56, the tuning rate may be increased with the direction dependent on the sequence of actuation. Four AM, FM and CB stations may be preset for push-button recall by tuning the receiver using the TUNE or SEEK keys 56 or 46 until a desired station is displayed and thereafter sequentially actuating the SET key 70 and one of the four numbered keys 62–68. Time of day is normally displayed but the station to which the receivers are tuned may be recalled by actuating the RCL key 60. Switch actuators 74 and 76 labeled HR and MIN are provided for time setting purposes.

Figure 3:
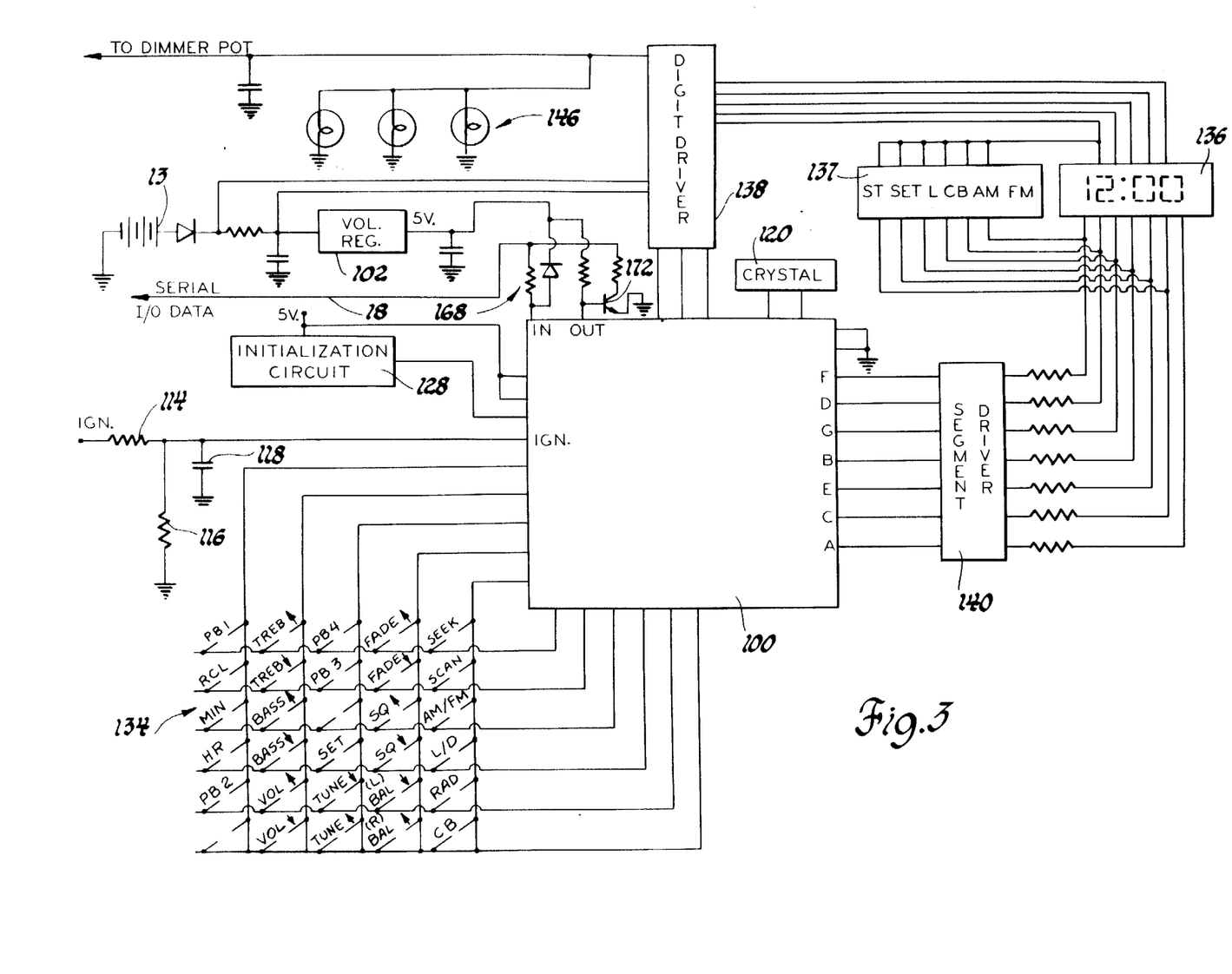
FIG. 3 is a block diagram of the control unit.

Referring now to FIG. 3, the control unit microcomputer is generally designated 100. A voltage regulator 102 provides a 5-volt input to the microcomputer 100 from the vehicle battery 13. Capacitors filter the input and output of the regulator 102. The microcomputer 100 monitors the status of the ignition switch which is connected thereto through voltage dividing resistors 114 and 116 and filter capacitor 118. Timing input to the microcomputer 100 is provided by a quartz crystal 120. The microcomputer 100 receives a power-up reset input from an initialization circuit 128 when the battery 13 is connected to the circuitry. The key actuated switches of the control unit 10 are arranged in a matrix configuration generally designated 134. The microcomputer 100 is programmed to scan and encode the status of the switch matrix in a conventional manner.

The microcomputer 100 controls a 5-digit, 7-segment display through a digit driver 138 and a segment driver 140 in a conventional manner. The display includes a 3½ digit display 136 and an enunciator 137. The enunciator 137 includes six LED's which are energized to respectively illuminate the designated legends depending on the status of the receiver. In addition, to the three select inputs from the microcomputer, the digit driver 138 receives a filtered input from the vehicle headlamps dimmer potentiometer (not shown) which controls the brightness of the display. Panel lights 146 illuminate the legends on the keys.

Data is received from the remote unit 12 over the data bus 18 connected to a data input pin of the microcomputer 100. A protection network generally designated 168 protects the microcomputer 100 from transients on the data bus. The data bus 18 is connected to the collector of a drive transistor 172 which has its emitter grounded and its base connected to the data output pin of microcomputer 100.

Figure 4:
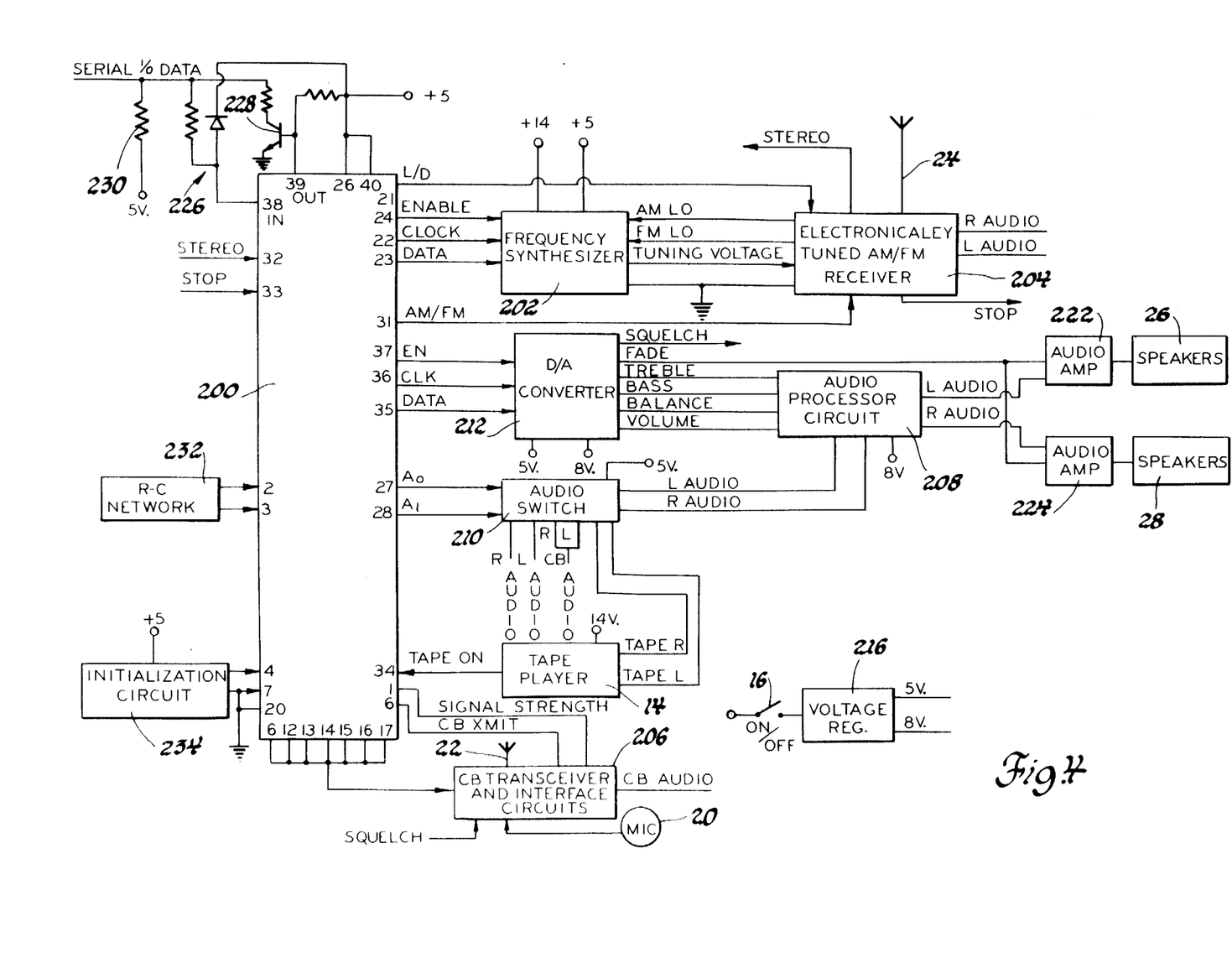
FIG. 4 is a block diagram of the remote unit.

Referring now to FIG. 4, the remote unit 12 includes a microcomputer 200 which controls an AM/FM receiver 204 and a CB transceiver 206. The microcomputer 200 controls the tuning of the receiver 204 by providing a tuning code number to a frequency synthesizer 202, which in turn provides a tuning voltage to the receiver. The microcomputer 200 also provides an AM/FM input to the receiver 204 to select the proper band and an L/D input to set the threshold level at which the STOP signal will be generated during a SEEK operation. The microcomputer 200 provides a code number to the CB transceiver 206 which includes a frequency synthesizer for tuning the transceiver in accordance with the code. The microcomputer 200 provides a code to an audio switch 210 which routes the audio from the receiver 204, tape player 14, or CB transceiver 206, to an audio processor circuit 208. The fourth code to the switch 210 mutes the audio. The BASS, TREBLE, BALANCE and VOLUME settings are determined by dc control voltages applied to the circuit 208. The dc control voltages correspond to digital data provided by the computer 200, which is converted to analog signals by a D/A converter 212. The output of the audio processor circuit 208 and the FADE control voltage is fed to amplifiers 222 and 224, which drive the speakers 26 and 28. The microcomputer 200 receives status inputs such as a STEREO and STOP inputs from the receiver 204 and two inputs from the CB transceiver 206 indicating when the CB is in the transmit mode and when the received signal strength is above the SQUELCH level. The microcomputer 200 also receives a status input from the tape player 14 indicating whether a tape is inserted. A voltage regulator 216 provides 5 to 8 volt regulated outputs as necessary to the various components when power is supplied from the switch 16 to the remote unit.

The data bus 18 is connected to a data input pin through a protection network generally designated 226 that is driven from the data output pin through a buffer transistor 228. The bus 18 is connected to the regulated 5-volt line through a pull-up resistor 230. Thus, the bus is normally high in its inactive state unless pulled down to its active state by the microcomputer 100 or the microcomputer 200. By locating the resistor 230 at the remote unit 12, the data bus 18 will go low when power is removed from the unit 12. This permits the state of the data bus to provide an indication of whether the unit 12 is powered up making it unnecessary to monitor the ON/OFF switch 16.

An R-C network 232 provides a time base for the microcomputer 200. Since the microcomputer 200 acts as a slave when communicating with the microcomputer 100, precise timing can be achieved in the slave microcomputer 200 with a relatively unprecise and inexpensive time base. This results from the fact that the data bit rate set by the microcomputer 100 is precise and because each bit is synchronized as explained hereinafter. An initialization circuit 234 provides a power-up reset to the microcomputer 200.

As previously indicated, the function of the master microcomputer 100 is to read the status of the switch matrix, control the display and control the timing of data communication with the slave microcomputer 200. The microcomputer 100 outputs a specific code for each of the individual keys when it is pressed. If no key is being pressed, a NULL code is output. The various codes may be stored in a look-up table in the on-chip ROM of microcomputer 100. All data transfers between the microcomputers 100 and 200 are initiated by the master microcomputer 100 and it sets the pace. For synchronization purposes, each group of eight bits is preceeded by a start bit. The response to the start bit is an acknowledge bit from the slave microcomputer 200 indicating whether or not it is ready for a transfer to take place. If the slave microcomputer 200 is not ready, then the master microcomputer reinitiates a start bit and this continues until the slave microcomputer 200 is ready. Then the eight bits of a data word follow without interruption. When the slave microcomputer 200 receives a message it checks a look-up table to determine the function to perform. If, for example, the TUNE key was pushed, the slave microcomputer 200 either increments or decrements the present station, outputs the new station number to the frequency synthesizer 202 and outputs the new station code to the master microcomputer 100 for display. If the SEEK switch is activated, the microcomputer 200 initiates a search through the appropriate AM, FM or CB band until a signal strength of a predetermined level is received. This is accomplished by incrementing the frequency code number supplied by the microcomputer 200 to the appropriate frequency synthesizer and monitoring the STOP output of the receiver 204 or signal strength output of the transceiver 206. The implementation of the SCAN function is similar to the SEEK function. When SCAN is commanded, the microcomputer 200 enters the SEEK mode and when a listenable station is acquired remains on the station for a predetermined time interval. If while on station the SCAN switch is activated, the receiver will remain on station, otherwise the SEEK mode will be reentered.

Figure 5:
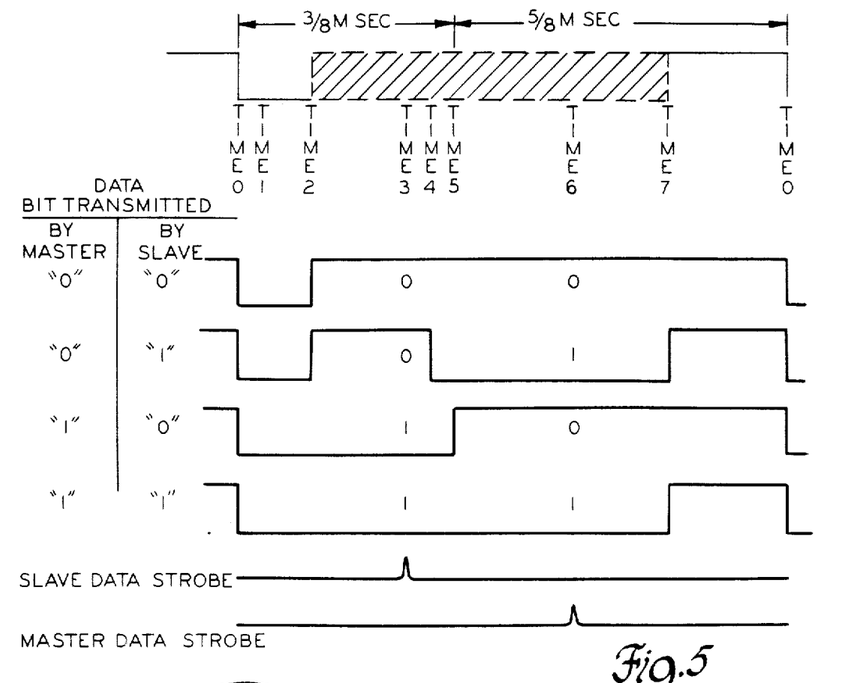
FIG. 5 is a timing diagram of a bit transfer period.

The transfer of data between the two microcomputers 100 and 200 will be described with reference to the timing diagram shown in FIG. 5. A data bit is transferred between the two microcomputers 100 and 200 each bit transfer period which is shown as consisting of a 1 millisecond time interval. The microcomputer 100 causes the data bus to transcend from a high to a low level to initiate a bit transfer period at TIME 0. The microcomputer 100 causes the data bus to go high at TIME 2 if a "0" data bit is to be transmitted and maintains the line low if a "1" data bit is to be transmitted. At TIME 3 the microcomputer 200 inputs the data bit transmitted by the microcomputer 100. At TIME 5 microcomputer 100 releases the data bus so that it may return to a high state. Transmission of a data bit from the microcomputer 200 to the microcomputer 100 is accomplished by the microcomputer 200 controlling the state of the bus after TIME 3. If a "0" data bit is to be transmitted, the microcomputer 200 allows the bus to return to a high level at TIME 5 or to remain at the high level established at TIME 2 for the remainder of the bit transfer period. To transmit a "1" data bit, the microcomputer 200 pulls the line low at TIME 4. At TIME 6 the microcomputer 100 inputs the data bit transmitted by the microcomputer 200. The microcomputer 200 allows the bus to return high at TIME 7 to ensure that the bus is high at the start of the next bit transfer period. It will be apparent that while the aforementioned activity at TIME 4 is shown to occur before TIME 5, the only requirement for accurate communication of the data bit from the microcomputer 200 to the microcomputer 100 is that this activity occurs after TIME 3 and before TIME 6.

Figure 6:
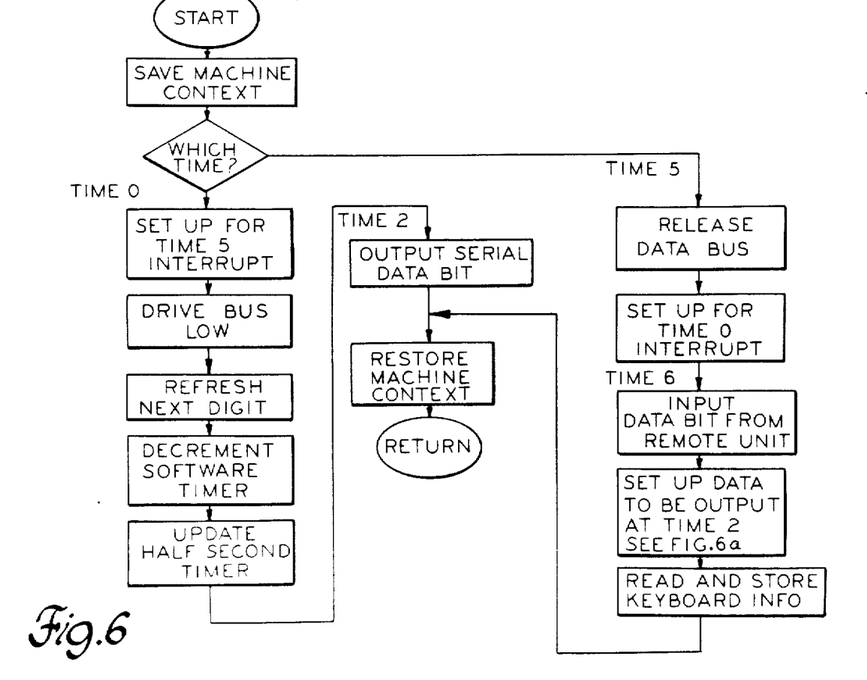
FIGS. 6 and 7 are flow charts of the timer interrupt subroutines in the master and slave microcomputers, respectively.

The transfer of data between the two microcomputers is under the control of the timer in the master microcomputer 100. During the power-up initialization routine of the master microcomputer 100, the timer is preset to generate an interrupt after the initialization subroutine is completed. The flowchart in FIG. 6 depicts the timer interrupt service subroutine for the master microcomputer 100. In response to the interrupt the machine context is saved and a determination is made as to whether the interrupt occurred at TIME 0 or TIME 5 of the bit transfer period. This may be done by testing a flag. If this interrupt occurred at TIME 0, the timer is preset to generate another interrupt in $\frac{3}{8}$ millisecond. After the timer is preset, the data bus is pulled low to initiate the bit transfer period. Since the timer interrupt subroutine is entered each millisecond, certain time related functions are performed during the interrupt subroutine. For example, one digit of the display is refreshed each time this subroutine is entered. Also a half second timer is updated for use in incrementing Time-of-Day. At TIME 2, the data bus is released to output a "0" bit to the remote unit microcomputer or is held low to output a "1" bit. A return from the subroutine is executed after the machine context is restored.

Figure 6A:
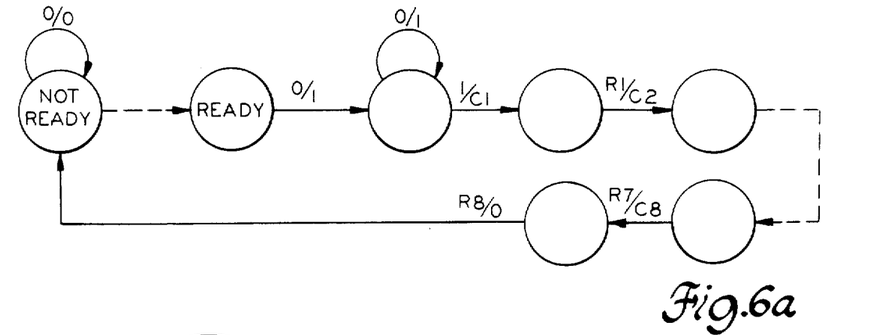
FIGS. 6a and 7a are state diagrams depicting the serial I/O status of the master and slave microcomputers when the timer interrupt subroutines of FIGS. 6 and 7 respectively are entered.

The TIME 5 interrupt in the microcomputer 100 occurs $\frac{3}{8}$ milliseconds after the TIME 0 interrupt. At this time the microcomputer 100 releases control of the data bus and the microcomputer 200 may assume control by pulling the data bus low to transmit a "1". Otherwise a "0" is transmitted. After the microcomputer 100 releases control of the bus it sets its timer to generate the next interrupt in $\frac{5}{8}$ milliseconds. Thereafter, the data bits placed on the line by the microcomputer 200 is stored in the microcomputer 100 and the next data bit is set up for output (during TIME 2) to the microcomputer 200. Thereafter, the keyboard is read, the machine context is restored and control is returned to the main program. As shown by the state diagram in FIG. 6a, the master microcomputer 100 outputs a "0" whenever it is NOT READY to transmit. When the master microcomputer 100 is READY to transmit, it outputs a "1" and goes to a state where it waits until a "1" is received from the slave microcomputer 200. When the master microcomputer 100 inputs a "1" from the slave microcomputer 200, it outputs the first data bit C1. Thereafter it progresses through each state until the last bit of the word R8 is received from the slave microcomputer 200 at which state the master microcomputer 200 outputs a "0" indicating the NOT READY state.

Figure 7:
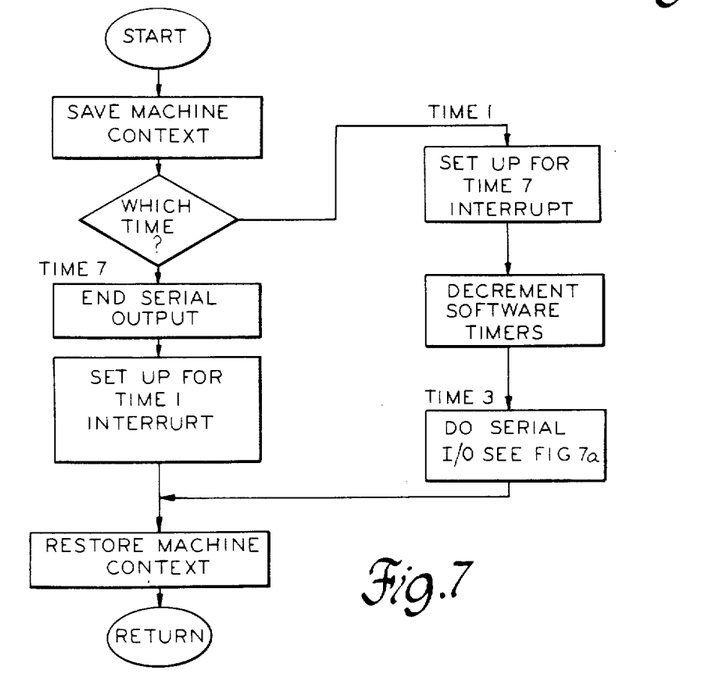
Figure 7A:
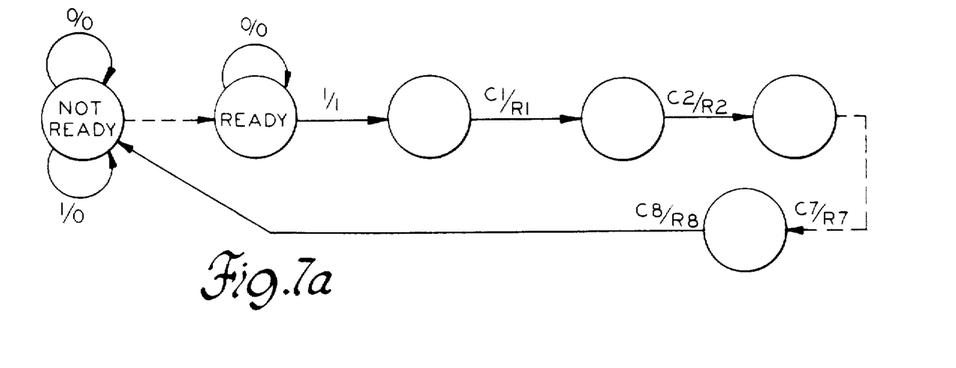

Whenever the remote unit is energized from the ON/OFF switch 16, the slave microcomputer 200 enters an initialization routine which sets its event counter to generate an interrupt in response to a high to low transition on the data bus. As previously indicated, this transition occurs when the microcomputer 100 initiates the bit transfer period at TIME 0. The flowchart in FIG. 7 depicts the timer interrupt subroutine for the slave microcomputer 200. After the machine context is saved, a determination is made as to whether the interrupt occurred at TIME 1 or TIME 7. If the interrupt occurred at TIME 1, the event counter is used as a timer and is present to generate an interrupt, in for example ⅜ millisecond (TIME 7), after the microcomputer 200 has read (TIME 6) the data bit placed on the line by the microcomputer 100. During TIME 1, the microcomputer 200 decrements various software timers used in controlling the receiver. Beginning at TIME 3 the slave microcomputer 200 does the serial input and output of data and thereafter restores the machine context and returns control to the main program. As shown in the state diagram of FIG. 7a, the bit output by the slave microcomputer 200 depends on its state during the TIME 1 interrupt. The slave microcomputer 200 outputs a "0" if it is NOT READY to transmit data. When the slave microcomputer 200 is READY to transmit, it assumes a READY state and waits in this state until it receives a "1" from the master microcomputer 100 whereupon it outputs a "1". Thereafter each bit C1-C8 of the word transmitted by the master microcomputer 100 is input and each bit R1-R8 of the word to be sent to the master microcomputer 100 is output. Returning to FIG. 7, if the interrupt occurred at TIME 7, the serial output is terminated by releasing control of the data bus 18, and the event counter is preset to generate an interrupt at TIME 1.

Figure 8:
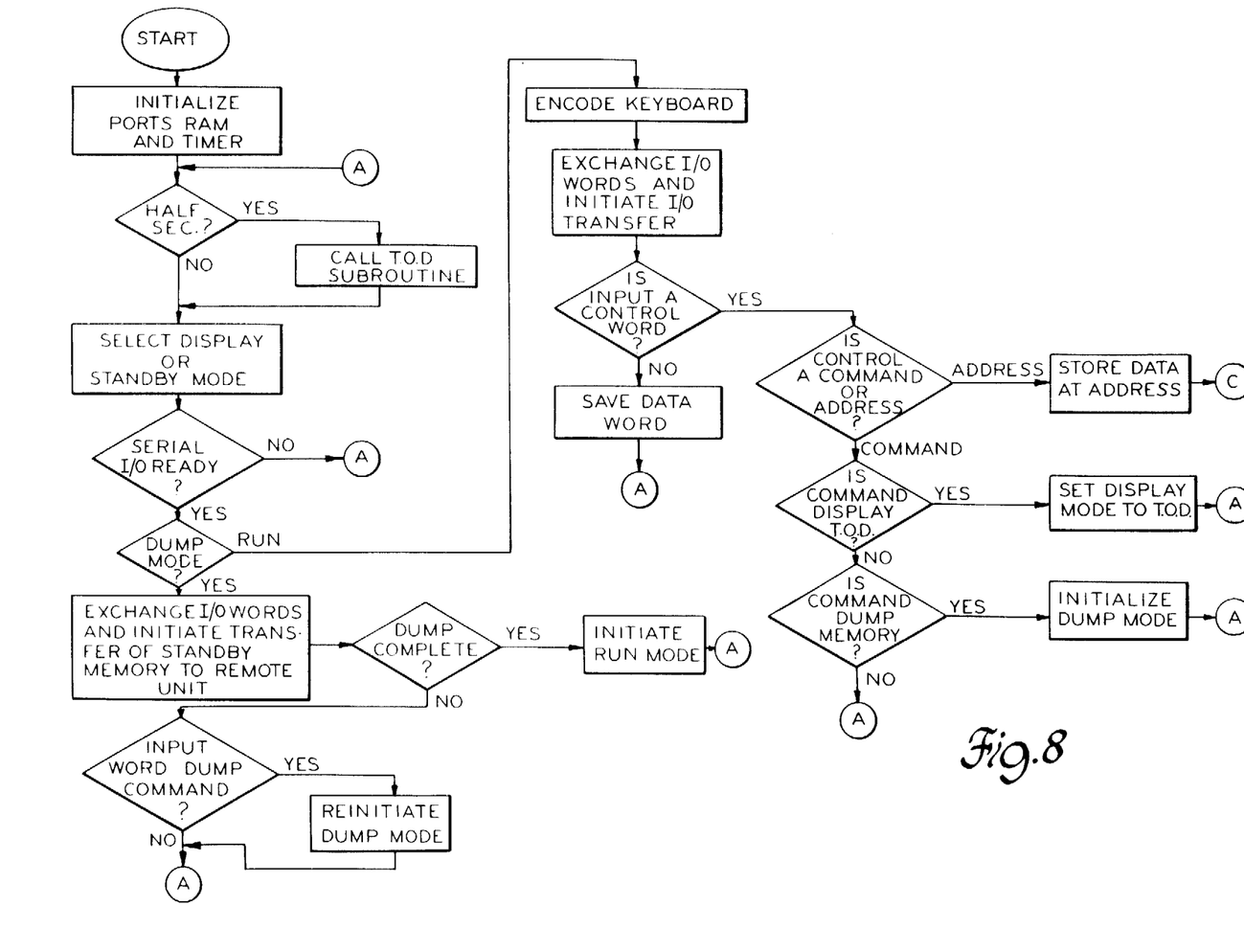
FIGS. 8 and 9 are flow charts depicting the main program of the master microcomputer.
Figure 9:
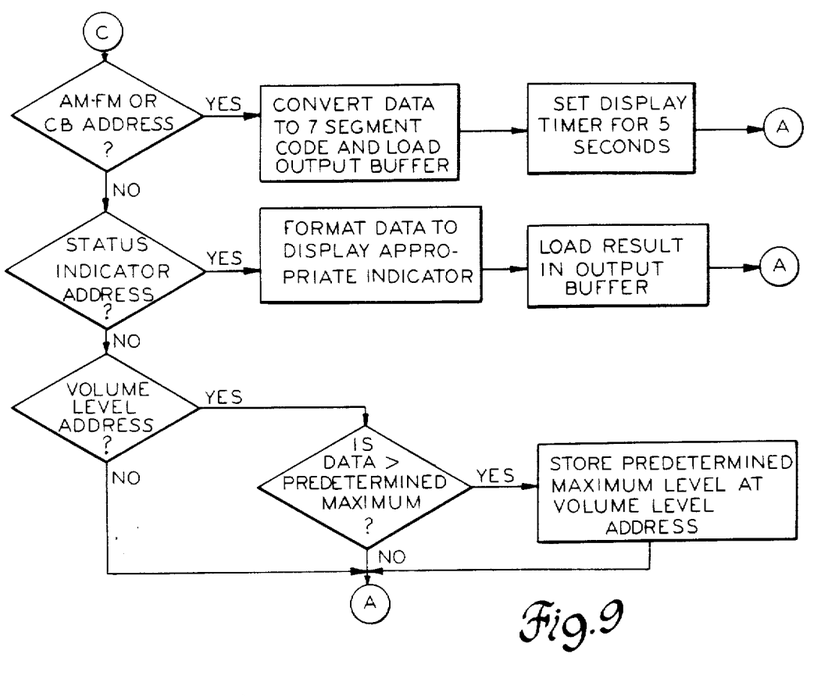
Figure 10:
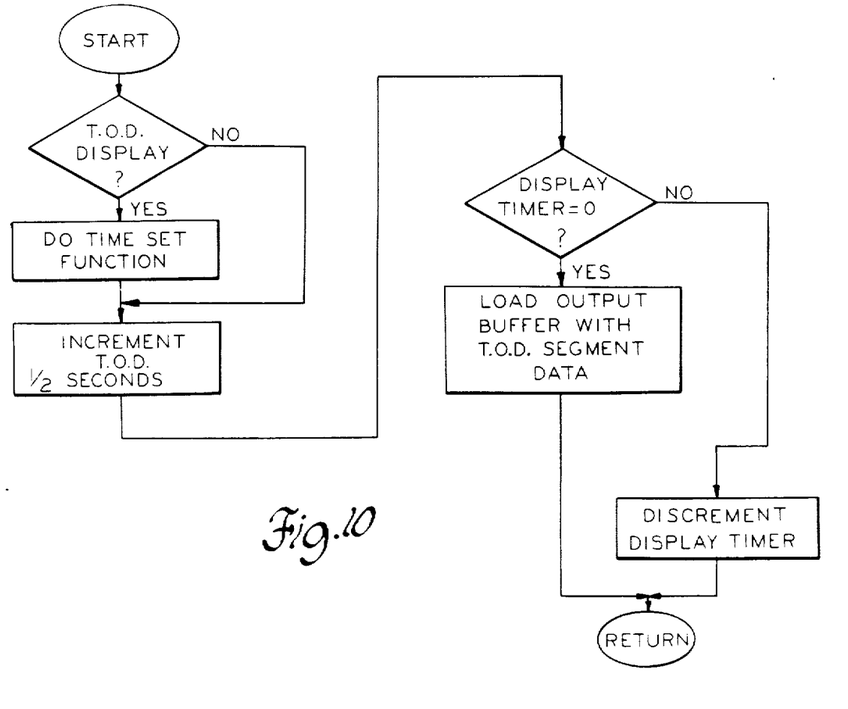
FIG. 10 is a flow chart of the Time-of-Day subroutine in the master microcomputer.

Referring now to FIGS. 8 and 9, the flowchart of the major loop of the master microcomputer 100 is shown. When power is first applied to the microcomputer 100 from the vehicle battery, an initialization routine is entered which initializes the I/O ports, RAM and timer with the desired startup data. Thus, initial preset AM, FM and CB channels and audio setting are established, the timer is preset to generate an interrupt and initial flag conditions are established. After initialization, the timer is started and the major loop is entered. The program of the microcomputer 100 executes LOOP A until a complete byte of data has been received from the microcomputer 200 and a new byte of data is ready for transfer to the microcomputer 200. During LOOP A, a Time-of-Day (TOD) subroutine is called each half-second, during which the Time-of-Day counters are incremented and the Time-of-Day counters may be set by the operator to reflect the correct time. The flowchart for the Time-of-Day subroutine is shown in FIG. 10. Also, during LOOP A the microcomputer 100 is placed in the display or standby mode depending on the state of the ignition switch and the RECALL switch. The standby mode is a low power condition where the display is turned off whenever the ignition switch is turned off. During this standby mode, the RECALL switch may be actuated to set up conditions for energizing the display for 5 seconds.

If a new data word is ready for transfer to the microcomputer 200, the program of the microcomputer 100 does a test to determine whether it should operate in the DUMP or RUN mode. The DUMP mode is commanded by the microcomputer 200 each time it is powered-up from the ON/OFF switch 16 in order to reestablish the conditions existing at power-down. During the DUMP mode, the data in the RAM of the microcomputer 100 needed to reestablish the operating conditions prior to power-down is transferred to the RAM of microcomputer 200. Once the last location has been dumped to the remote unit, a flag is set so that the next time through the loop, the RUN mode will be entered. If during the DUMP mode the microcomputer 100 receives a DUMP command, the dump is reinitialized.

In the RUN mode, the keyboard is encoded and the encoded word is loaded in a register for output to the remote unit and the complete word just received from the remote unit is operated upon. The microcomputer 200 transmits data words and/or control words. A control word may be either an address for the data word or a command. If the word received from the microcomputer 200 is data, it is saved and the program exits to LOOP A. When an address word is received, the data word previously transmitted and saved is stored at the address specified. This updates the RAM in the microcomputer 100 with the status of the receiver so that the receiver may be initialized in the event of a DUMP command. A data word is transmitted prior to its associated address word to insure that only valid data will be loaded into the address in the event of a power-down before both address and data words are received. As shown in FIG. 9, the type of data is determined from the associated address. If the address is allocated to an AM, FM or CB frequency, the new frequency data word is converted to the appropriate 7-segment code and loaded in the output buffer and a display timer is set for a 5 second display of the frequency. If the address corresponds to one of the status indicators, the data word is converted to an appropriate format for display and stored in the output buffer. If the address corresponds to the VOLUME level, the data is compared with a predetermined maximum initial turn-on volume. If greater than the predetermined maximum for initial turn-on, the data at the volume level address is replaced with the predetermined level. This insures that the initial turn-on volume is at a reasonable level, such as mid-range. Returning to FIG. 8, if the control word is a command, the type of command is determined from a look-up table. Typical commands are DISPLAY TIME of DAY which is appropriate when a tape is inserted in the tape player and DUMP MEMORY which is appropriate when the microcomputer 200 is powered-up.

As shown in FIG. 10, when the TOD subroutine is called, the Time-of-Day counters are incremented. If Time-of-Day is being displayed, the operator may activate the minutes or hours switches to set the display to the correct time. During the TOD subroutine, the display timer is decremented and when the 5 second period for display of frequency has timed out, the output buffer is loaded with 7-segment data for display of Time-of-Day.

Figure 11:
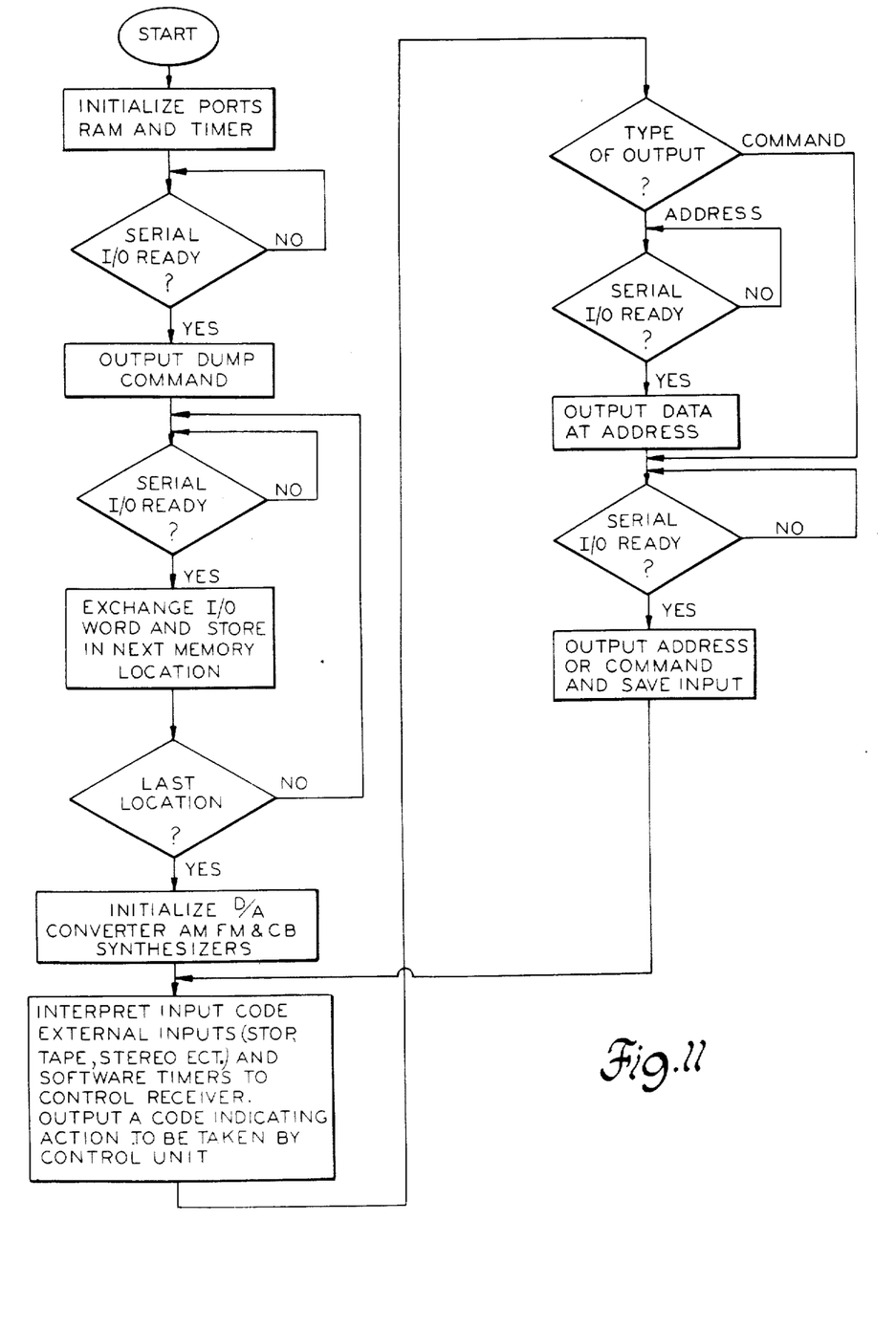
FIG. 11 is a flow chart of the main program of the slave microcomputer.

A flowchart of the major loop for the slave unit microcomputer 200 is shown in FIG. 11. As previously indicated, when power is applied to the remote unit from the ON/OFF switch 16, the program enters an initialization subroutine which initializes the ports, clears the RAM locations and places the timer in its event counter mode. When the master microcomputer 100 indicates it is READY to receiver data, the slave microcomputer 200 transfers a DUMP MEMORY command to the microcomputer 100. In response to this command, the microcomputer 100 transfers the data corresponding to the conditions existing when the remote unit 12 was powered-down as well as the AM/FM/CB presets for the keys 1-4. After the RAM of the microcomputer 200 is loaded with this data, the D/A converter 212 and the AM/FM synthesizer 202 and CB transceiver 206 are initialized.

Once the microcomputer 200 is operating under the conditions existing at power-down, the microcomputer 100 transmits keyboard status information which is decoded by the microcomputer 200 to determine what action should be taken. For example, if the decoded information corresponds to one of the audio settings, such as VOLUME, then the information will be in the form of a step change either up or down in the level of the audio setting. Control is accomplished by formating and serially feeding the new data to the D/A converter 212 which produces the new analog output voltage. The microcomputer 200 also responds to the various external inputs such as STOP and to various software timers such as a SCAN timer and MUTE timers, to control the operation of the receiver. When the microcomputer 100 is READY to receive information the microcomputer 200 outputs either a command or data followed by an address indicating what action should be taken by the microcomputer 100, for example, display the new station or update the status information.

The embodiments of the invention in which an exclusive property or privilege is claimed are defined as follows:

1. A communication system comprising a control unit including a master computer and a remote unit including a slave computer, a single wire bidirectional data bus interconnecting said master and slave computers, output means coupled to said slave computer, input means coupled to said master computer for selecting operating functions of said output means, said master computer communicating information to said slave computer regarding the status of said input means and receiving information from said slave computer regarding the status of said output means, said master computer controlling the timing of the transfer of said information by periodically initiating a bit transfer period and assuming control of the data bus during a first portion of said period and relinquishing control of the data bus during the remaining portion of said period, said slave computer responsive to the initiation of said bit transfer period for reading the data bus during said first portion and thereafter assuming control of the data bus, said master computer reading the data bus during said remaining portion, said slave computer relinquishing control of the data bus prior to initiation of a succeeding bit transfer period, whereby a bit is transmitted from the master to the slave computer and a bit is transmitted from the slave to the master computer during each bit transfer period.

2. A radio receiver system comprising a control unit including a master computer and a remote unit including a slave computer, a single wire bidirectional data bus interconnecting said master and slave computers, radio receiver means coupled to said slave computer and controlled thereby, input switch means coupled to said master computer for selecting operating functions of said radio receiver means, said master computer including memory means for storing data regarding the status of said radio receiver, display means controlled by said master computer for indicating the status of said radio receiver means in accordance with the data in said memory means, means normally applying power to said master computer means for continuously energizing said memory means, for selectively applying power to said slave computer, said master computer communicating data to said slave computer regarding the status of said input switch means and receiving data from said slave computer regarding the status of said radio receiver means for updating said memory means and said display means, said master computer controlling the timing of the transfer of said data by periodically initiating a bit transfer period during which a bit of data is transmitted from the master computer to the slave computer and a bit of data is transmitted from the slave computer to the master computer.

3. The system defined in claim 2 wherein said remote unit includes means for normally placing said data bus to return in an inactive state when power is applied to said remote unit, said master computer placing said data bus in an active state to initiate said bit transfer period and permitting said data bus to return to said inactive state after a relatively short or relatively long time interval depending on the binary coded bit to be output to said slave computer, said slave computer reading the state of said data bus after expiration of said short time interval and prior to expiration of said long time interval and thereafter assuming control of the data bus by placing said data bus to said active state to output one binary coded bit or permitting said data bus to return to said inactive state to output the other binary coded bit, said slave computer releasing control of said data bus a predetermined time interval after initiation of said bit transfer period, said master computer reading the state of said data bus while said slave computer has control of said data bus.

4. The system defined in claim 2 wherein said master computer includes presettable timer means for generating first and second recurring interrupts, said master computer responsive to said first interrupt for initiating said bit transfer period and for outputing a data bit to said slave computer, said slave computer including means for generating a third interrupt in response to initiation of said bit transfer period and a fourth interrupt a predetermined time interval thereafter, said slave computer responding to said third interrupt by reading the data bit output by said master computer and outputing a data bit to said master computer, said master computer responding to said second interrupt by terminating the output of said data bit to said slave computer and for reading the data bit output by said slave computer, said slave computer responding to said fourth interrupt by terminating the output of a data bit to said master computer.

5. A radio receiver system comprising a control unit including a master computer and a remote unit including a slave computer, a single wire bidirectional data bus interconnecting said master and slave computers, radio receiver means coupled to said slave computer and controlled thereby, input switch means coupled to said master computer for selecting operating functions of said radio receiver means, said master computer including memory means for storing data regarding the status of said radio receiver, display means controlled by said master computer for indicating the status of said radio receiver in accordance with the data in said memory, means normally applying power to said master computer means for continuously energizing said memory means, means for selectively applying power to said slave computer, said master computer communicating data to said slave computer regarding the status of said input switch means and receiving data from said slave computer regarding the status of said radio receiver means for updating said memory means and said display means, each data word transferred between said master computer and said slave computer containing a plurality of bits, the bits of the words transferred from the master computer to the slave computer being interleaved with the bits transferred from the slave computer to the master computer.

6. The system defined in claim 5 wherein said slave computer transmits either a control word or a data word to said master computer, said control word being either a command to said master computer or an address where a previously transmitted data word is to be stored in said memory of said master computer.

7. The system defined in claim 6 wherein said slave computer is responsive to application of power thereto to output an initialization command to said master computer, said master computer responsive to said initialization command for transferring data regarding the status of said receiver means at power-down to initialize said receiver means to the status existing prior to power-down.

8. The system defined in claim 5 wherein said master computer is provided with a relatively precise time base and said slave computer is provided with a relatively imprecise time base, said master computer normally displays time of day based on said relatively precise time base.

9. The system defined in claim 7 wherein said master computer is responsive to a volume level address for comparing the volume level data to a predetermined maximum volume level and for storing said predetermined maximum volume level in said memory means if said volume level data exceeds said predetermined maximum volume level to thereby limit the initialized volume of said receiver means to said predetermined maximum level.

10. A radio receiver system comprising a control unit including a master computer and a remote unit including a slave computer, a single wire bidirectional data bus interconnecting said master and slave computers, radio receiver means coupled to said slave computer and controlled thereby, input switch means coupled to said master computer for selecting operating functions of said radio receiver means, said master computer including memory means for storing data regarding the status of said radio receiver, display means controlled by said master computer for indicating the status of said radio receiver in accordance with the data in said memory means, means normally applying power to said master computer means for continuously energizing said memory means, power switch means located at said master control unit for selectively applying power to said slave computer, a pull up means located at said remote unit connected between said data bus and said power switch means to thereby place said bus in a first predefined state when power is applied and a second predefined state when power is disconnected.

* * * * *

UNITED STATES PATENT AND TRADEMARK OFFICE
CERTIFICATE OF CORRECTION

PATENT NO. : 4,503,513

DATED : March 5, 1985

INVENTOR(S) : Russell W. Pogue, Jr.

It is certified that error appears in the above-identified patent and that said Letters Patent is hereby corrected as shown below:

Column 9, Claim 2, line 57, after "receiver" insert -- means --.

Column 9, Claim 2, line 62, after "means," insert -- means --.

Column 10, Claim 5, line 57, after "memory" insert -- means --.

Signed and Sealed this

Nineteenth Day of November 1985

[SEAL]

Attest:

DONALD J. QUIGG

Attesting Officer

Commissioner of Patents and Trademarks